United States Patent
Yu et al.

(10) Patent No.: US 6,448,165 B1
(45) Date of Patent: Sep. 10, 2002

(54) METHOD FOR CONTROLLING THE AMOUNT OF TRIM OF A GATE STRUCTURE OF A FIELD EFFECT TRANSISTOR

(75) Inventors: Bin Yu, Sunnyvale, CA (US); Haihong Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/746,397

(22) Filed: Dec. 21, 2000

(51) Int. Cl.[7] .................. H01L 21/3205; H01L 21/4763
(52) U.S. Cl. ...................... 438/585; 438/197; 438/514; 438/519; 438/636
(58) Field of Search .................. 438/197, 301, 438/303, 305, 514, 516, 519, 520, 585, 586, 592, 595, 636; 257/408

(56) References Cited

U.S. PATENT DOCUMENTS

| | | | | |
|---|---|---|---|---|
| 5,633,177 A | * | 5/1997 | Anjum | 438/301 |
| 5,726,459 A | * | 3/1998 | Hsu et al. | 257/55 |
| 5,866,473 A | * | 2/1999 | Xiang et al. | 438/585 |
| 5,963,841 A | * | 10/1999 | Karlsson et al. | 438/952 |
| 6,013,570 A | * | 1/2000 | Yu et al. | 438/595 |
| 6,136,616 A | * | 10/2000 | Fulford et al. | 438/14 |
| 6,268,253 B1 | * | 7/2001 | Yu | 438/303 |
| 6,291,329 B1 | * | 9/2001 | Huang et al. | 438/585 |
| 6,362,111 B1 | * | 3/2002 | Laaksonen et al. | 438/725 |

\* cited by examiner

*Primary Examiner*—Carl Whitehead, Jr.
*Assistant Examiner*—Maria Guerrero
(74) *Attorney, Agent, or Firm*—Monica H. Choi

(57) ABSTRACT

For fabricating a field effect transistor within an active device area of a semiconductor substrate, a layer of gate dielectric material is deposited on the semiconductor substrate. A layer of gate electrode material is deposited on the layer of gate dielectric material, and the gate electrode material is a semiconductor material. At least one of an N-type dopant or a P-type dopant or a neutral dopant is implanted into the layer of gate electrode material such that the at least one of an N-type dopant or a P-type dopant or a neutral dopant has a dopant concentration in the layer of gate electrode material. A layer of photo-resist material, a layer of BARC (bottom anti-reflective coating) material, and the layer of gate electrode material are patterned to form a gate structure of the field effect transistor. The gate structure is comprised of the remaining gate electrode material, and the BARC (bottom anti-reflective coating) material remains on the gate structure. The BARC (bottom anti-reflective coating) material is then stripped from the gate structure using an etching reactant that etches both of the BARC (bottom anti-reflective coating) material and the gate electrode material. An etch rate of the gate electrode material in the etching reactant increases with an increase of the dopant concentration of the at least one of an N-type dopant or a P-type dopant or a neutral dopant within the gate electrode material. Sidewalls of the gate structure are trimmed by a trim length during the step of stripping the BARC (bottom anti-reflective coating) material from the gate structure. Thus, the dopant concentration of the at least one of an N-type dopant or a P-type dopant or a neutral dopant in the gate electrode material is adjusted to control the trim length of the gate structure.

12 Claims, 3 Drawing Sheets

METHOD FOR CONTROLLING THE AMOUNT OF TRIM OF A GATE STRUCTURE OF A FIELD EFFECT TRANSISTOR

TECHNICAL FIELD

The present invention relates generally to fabrication of field effect transistors having scaled-down dimensions, and more particularly, to fabrication of a field effect transistor with a trim of the gate structure during etching of a BARC (bottom anti-reflective coating) layer from the top of the gate structure with the amount of trim of the gate structure being controlled by adjusting the doping of the gate electrode material comprising the gate structure.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate structure 118 which may be comprised of polysilicon. A gate silicide 120 is formed on the polysilicon gate structure 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate structure 118 and the gate dielectric 116. When the spacer 122 is comprised of silicon nitride (SiN), then a spacer liner oxide 124 is deposited as a buffer layer between the spacer 122 and the sidewalls of the gate structure 118 and the gate dielectric 116.

As the dimensions of the MOSFET 100 are further scaled down, the length of the gate structure 116 between the drain extension 104 and the source extension 106 are desired to be in a range of nanometers. Such a small dimension may be difficult to achieve using conventional photolithography patterning processes. In that case, the length of the gate structure 116 may be further trimmed down after the gate structure 116 is formed using conventional photolithography patterning processes. In such a trimming process, a mechanism for adjusting the amount of trim of the length of the gate structure is desired for controlling the length of the gate structure.

SUMMARY OF THE INVENTION

Accordingly, in a general aspect of the present invention, the gate structure of the field effect transistor is trimmed during etching of a BARC (bottom anti-reflective coating) layer from the top of the gate structure with the amount of trim of the gate structure being controlled by adjusting the doping of the gate electrode material comprising the gate structure.

In one embodiment of the present invention, for fabricating a field effect transistor within an active device area of a semiconductor substrate, a layer of gate dielectric material is deposited on the semiconductor substrate. A layer of gate electrode material is deposited on the layer of gate dielectric material, and the gate electrode material is a semiconductor material. One of an N-type dopant or a P-type dopant is implanted into the layer of gate electrode material such that the one of an N-type dopant or a P-type dopant has a dopant concentration in the layer of gate electrode material. A layer of BARC (bottom anti-reflective coating) material is then deposited on the layer of gate electrode material. A layer of photo-resist material is deposited, and the layer of photo-resist material, the layer of BARC (bottom anti-reflective coating) material, and the layer of gate electrode material are patterned to form a gate structure of the field effect transistor. The gate structure is comprised of the remaining gate electrode material, and the BARC (bottom anti-reflective coating) material remains on the gate structure. The photo-resist material is removed from the BARC (bottom anti-reflective coating) material remaining on top of the gate structure.

The BARC (bottom anti-reflective coating) material is then stripped from the gate structure using an etching reactant that etches both of the BARC (bottom anti-reflective coating) material and the gate electrode material having the one of an N-type dopant or a P-type dopant. An etch rate of the gate electrode material having the one of an N-type dopant or a P-type dopant in the etching reactant increases with an increase of the dopant concentration of the one of an N-type dopant or a P-type dopant in the gate electrode material. Sidewalls of the gate structure are trimmed by a trim length during the step of stripping the BARC (bottom anti-reflective coating) material from the gate structure. Thus, the dopant concentration of the one of an N-type dopant or a P-type dopant in the gate electrode material is adjusted to control the trim length of the gate structure.

In another aspect of the present invention, an additional neutral dopant is implanted into the layer of gate electrode material such that the neutral dopant has a neutral dopant concentration in the layer of gate electrode material before the step of depositing the layer of BARC (bottom anti-reflective coating) material. The etch rate of the gate electrode material having the neutral dopant in the etching reactant increases with an increase of the neutral dopant concentration in the gate electrode material. Thus, the neutral dopant concentration of the neutral dopant in the gate electrode material is also adjusted to further control the trim length of the gate structure.

The present invention may be used to particular advantage when the gate electrode material is comprised of polysilicon, the neutral dopant is comprised of germanium, the BARC (bottom anti-reflective coating) material is comprised of silicon oxynitride (SiON) having a thickness in a range of from about 150 Å (angstroms) to about 250 Å (angstroms), and the etching reactant is comprised of phosphoric acid ($H_3PO_4$).

In this manner, the side walls of the gate structure are trimmed down to reduce the length of the gate structure beyond that achievable with photolithography processes with control of the trim length by adjusting the doping of the gate structure. In addition, the side walls of the gate structure are trimmed down during the step of stripping the BARC (bottom anti-reflective coating) material from the gate structure such that additional processing steps are minimized.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, and 9 refer to elements having similar structure and function.

DETAILED DESCRIPTION

Figure 1:
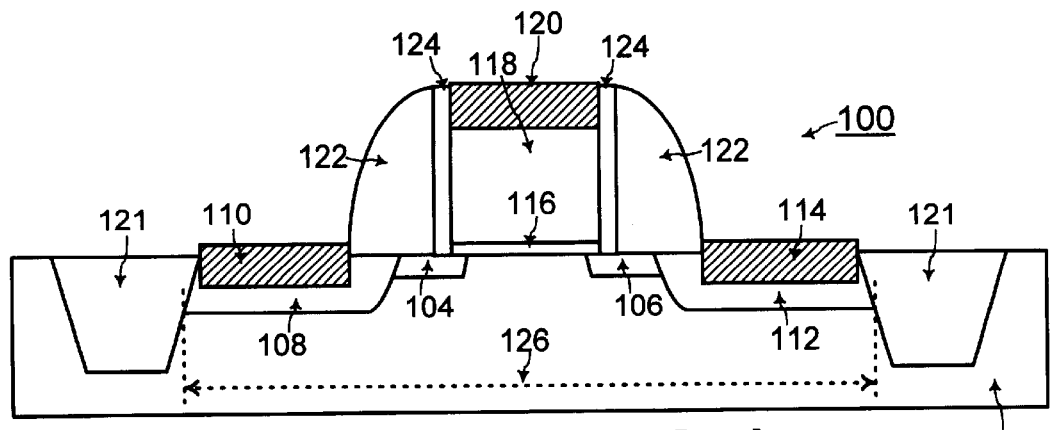
FIG. 1 shows a cross-sectional view of a MOSFET (Metal Oxide Semiconductor Field Effect Transistor)
Figure 2:
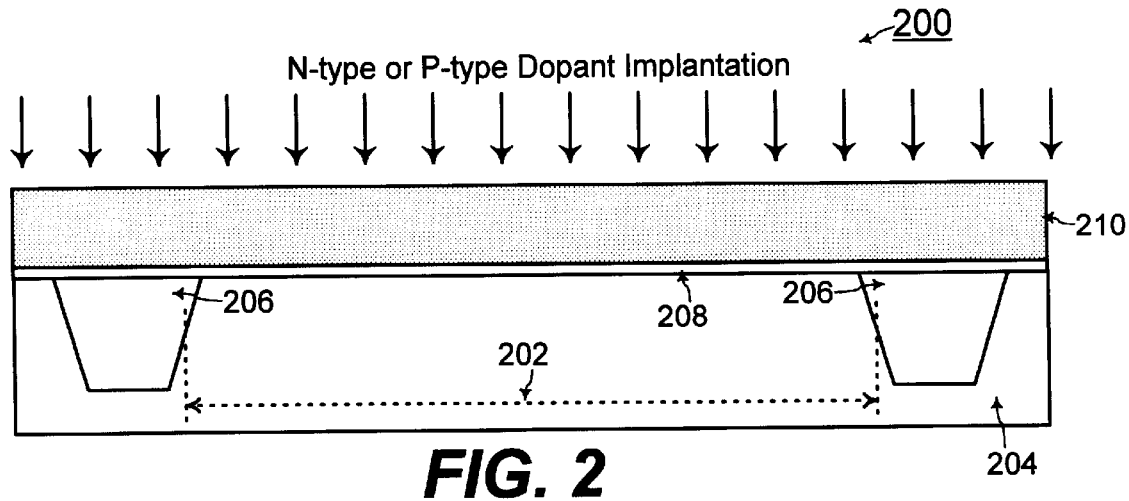
FIGS. 2, 3, 4, 5, 6, 7, 8, and 9 show cross-sectional views for illustrating the steps for fabricating a MOSFET (Metal Oxide Semiconductor Field Effect Transistor) having a gate structure that is trimmed during etching of a BARC (bottom anti-reflective coating) layer from the top of the gate structure with the amount of trim of the gate structure being controlled by adjusting the doping of the gate electrode material comprising the gate structure.

Referring to FIG. 2, a MOSFET (Metal Oxide Semiconductor Field Effect Transistor) 200 is to be fabricated within an active device area 202 of a semiconductor substrate 204 defined by shallow trench isolation structures 206. Processes for formation of shallow trench isolation structures for electrically isolating integrated circuit devices within a semiconductor substrate are known to one of ordinary skill in the art of integrated circuit fabrication.

For formation of a gate structure of the MOSFET 200, a layer of gate dielectric material 208 is deposited on the semiconductor substrate 204. The layer of gate dielectric material 208 may be comprised of silicon dioxide ($SiO_2$). In that case, the thickness of the layer of gate dielectric material 208 is in a range of from about 15 Å (angstroms) to about 25 Å (angstroms) for the MOSFET 200 having scaled down dimensions of nanometers.

Alternatively, the layer of gate dielectric material 208 may be comprised of a dielectric material having a dielectric constant that is higher than the dielectric constant of silicon dioxide ($SiO_2$), such as metal oxides (i.e., aluminum oxide ($Al_2O_3$), titanium dioxide ($TiO_2$), or tantalum oxide ($Ta_2O_5$), for example). When the layer of gate dielectric material 208 is comprised of such dielectric material with high dielectric constant, the layer of gate dielectric material 208 has higher thickness to advantageously minimize charge carrier tunneling through the gate dielectric of the MOSFET 200, as known to one of ordinary skill in the art of integrated circuit fabrication. Processes for deposition of such dielectric material are known to one of ordinary skill in the art of integrated circuit fabrication.

Further referring to FIG. 2, a layer of gate electrode material 210 comprised of a semiconductor material is deposited on the layer of gate dielectric material 208. In one embodiment of the present invention, the layer of gate electrode material 210 is comprised of polysilicon. Processes, such a LPCVD (liquid phase chemical vapor deposition), for deposition of such a semiconductor material for the layer of gate electrode material 210 are known to one of ordinary skill in the art of integrated circuit fabrication. The LPCVD process for depositing the layer of gate electrode material 210 is performed at a temperature in a range of from about 550° Celsius to about 650° Celsius according to one embodiment of the present invention.

In addition, referring to FIG. 2, an N-type dopant or a P-type dopant is implanted into the layer of gate electrode material 210. An N-type dopant is implanted into the layer of gate electrode material 210 for fabrication of an NMOSFET (N-channel Metal Oxide Semiconductor Field Effect Transistor). Alternatively, a P-type dopant is implanted into the layer of gate electrode material 210 for fabrication of a PMOSFET (P-channel Metal Oxide Semiconductor Field Effect Transistor). Either the N-type dopant or the P-type dopant implanted into the layer of gate electrode material 210 has a dopant concentration in the layer of gate electrode material 210. Implantation processes for implanting such N-type dopant or P-type dopant are known to one of ordinary skill in the art of integrated circuit fabrication. In addition, process parameters such as dopant dose and implantation energy are varied to adjust the dopant concentration of the N-type dopant or P-type dopant within the layer of gate electrode material 210. Mechanisms for varying such parameters during dopant implantation processes are known to one of ordinary skill in the art of integrated circuit fabrication.

An N-type dopant is comprised of a dopant which introduces more negative charge carriers (i.e., electrons) when implanted in the layer of gate electrode material 210. A P-type dopant is comprised of a dopant which introduces more positive charge carriers (i.e., holes) when implanted in the layer of gate electrode material 210. For example, when the layer of gate electrode material 210 is comprised of polysilicon, the N-type dopant may be comprised of phosphorous, and the P-type dopant may be comprised of boron.

Figure 3:
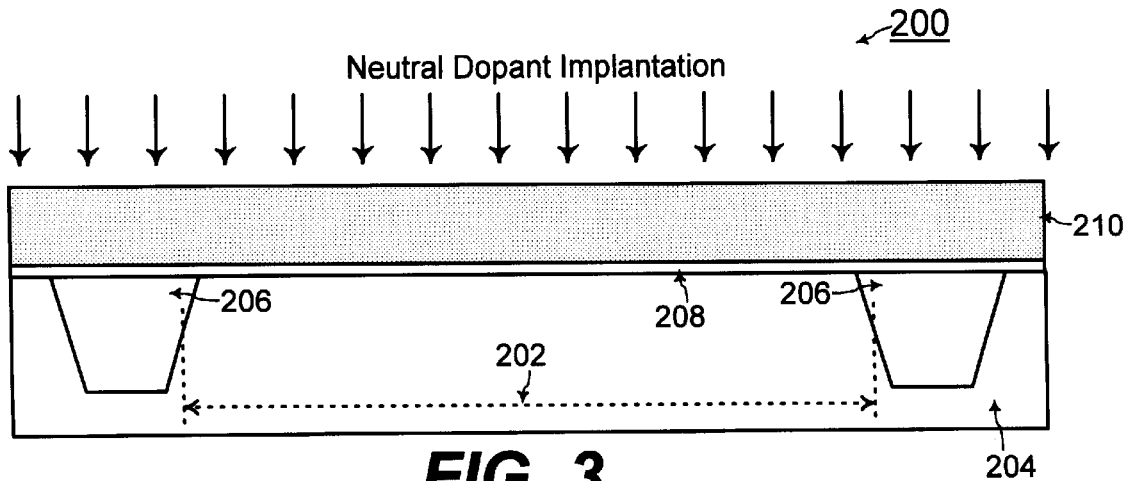

Referring to FIG. 3, in an alternative embodiment of the present invention, in addition to the N-type dopant or P-type dopant implanted into the layer of gate electrode material 210 as illustrated in FIG. 2, a neutral dopant is also implanted into the layer of gate electrode material 210. The neutral dopant implanted into the layer of gate electrode material 210 has a neutral dopant concentration in the layer of gate electrode material 210. A neutral dopant is comprised of a dopant which does not introduce either of more negative or more positive charge carriers (i.e., electrons or holes) when implanted in the layer of gate electrode material 210. For example, when the layer of gate electrode material 210 is comprised of polysilicon, the neutral dopant is comprised of germanium in one embodiment of the present invention.

Implantation processes for implanting such neutral dopant are known to one of ordinary skill in the art of integrated circuit fabrication. In addition, process parameters such as dopant dose and implantation energy are varied to adjust the neutral dopant concentration of the neutral dopant implanted into the layer of gate electrode material 210. Mechanisms for varying such parameters during dopant implantation processes are known to one of ordinary skill in the art of integrated circuit fabrication.

After any of the N-type dopant or P-type dopant or neutral dopant has been implanted into the layer of gate electrode material 210, a thermal anneal process is performed for more evenly distributing the dopant concentration of any of the N-type dopant or P-type dopant or neutral dopant implanted into the layer of gate electrode material 210. In one embodiment of the present invention, a rapid thermal anneal (RTA) process at a temperature in a range of from about 950° Celsius to about 1025° Celsius is performed. Such thermal anneal processes are known to one of ordinary skill in the art of integrated circuit fabrication.

Figure 4:
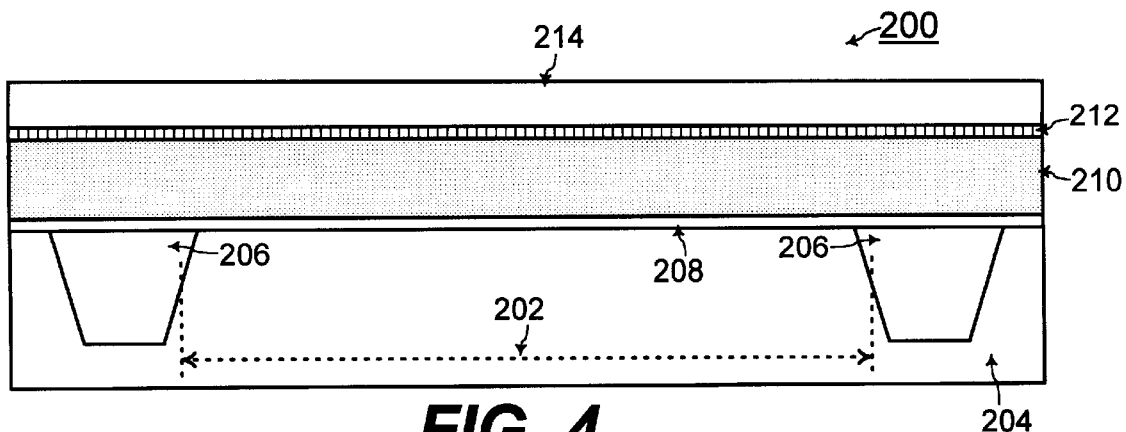

Referring to FIG. 4, a layer of BARC (bottom anti-reflective coating) material 212 is deposited on the layer of gate electrode material 210. In one embodiment of the present invention, the layer of BARC (bottom anti-reflective coating) material 212 is comprised of silicon oxynitride (SiON) having a thickness in a range of from about 150 Å (angstroms) to about 250 Å (angstroms), and processes for deposition of such a layer of BARC (bottom anti-reflective coating) material 212 are known to one of ordinary skill in the art of integrated circuit fabrication.

Further referring to FIG. 4, a layer of photo-resist material 214 is deposited on the layer of BARC (bottom anti-reflective coating) material 212. The layer of BARC (bottom anti-reflective coating) material 212 is relatively non-reflective of photon beams used during patterning of the layer of photo-resist material 214 such that the layer of photo-resist material 214 may be patterned more accurately during a photolithography process, as known to one of ordinary skill in the art of integrated circuit fabrication.

Figure 5:
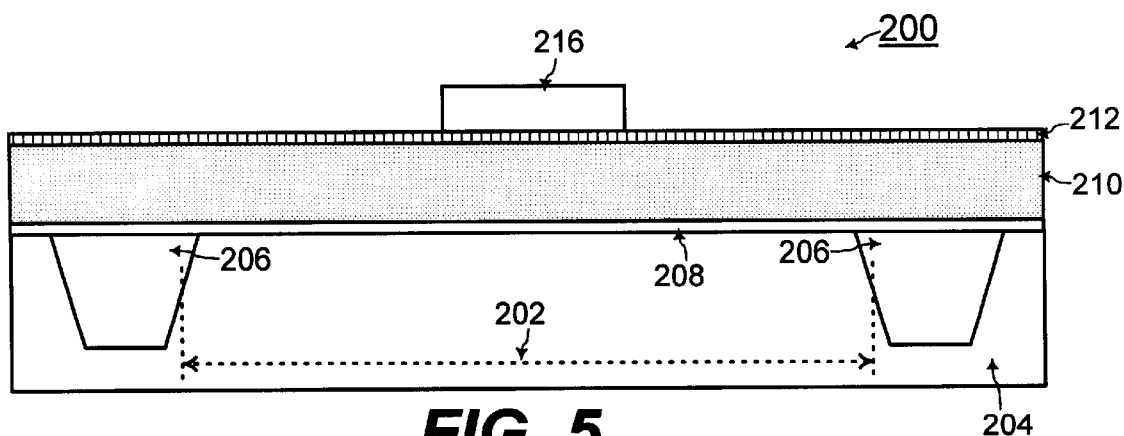

Referring to FIG. 5, the layer of photo-resist material 214 is patterned and etched to form a gate photoresist structure 216 on the layer of BARC (bottom anti-reflective coating) material 212. The gate photoresist structure 216 is formed to be over the active device area 202 of the semiconductor substrate 204. Processes for patterning and etching the layer of photo-resist material 214 to form the gate photoresist structure 216 are known to one of ordinary skill in the art of integrated circuit fabrication.

Figure 6:
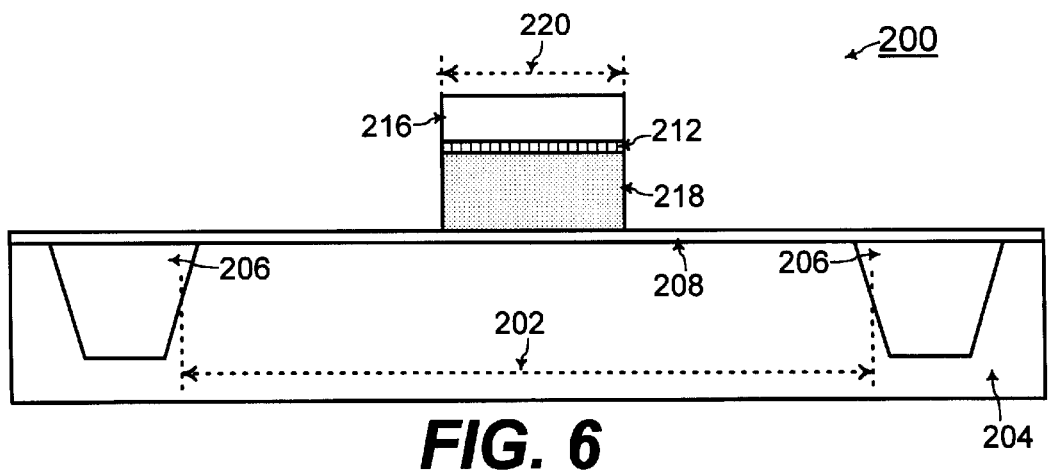

Referring to FIGS. 5 and 6, exposed regions of the layer of BARC (bottom anti-reflective coating) material 212 and the layer of gate electrode material 210 are etched away to form a gate structure 218. Processes for patterning the layer of BARC (bottom anti-reflective coating) material 212 and the layer of gate electrode material 210 to form the gate structure 218 are known to one of ordinary skill in the art of integrated circuit fabrication. The gate structure 218 is comprised of the semiconductor material of the layer of gate electrode material 210 remaining under the gate photoresist structure 216. In addition, the BARC (bottom anti-reflective coating) material 212 remains on the gate structure 218. Referring to FIG. 6, after the gate structure 218 is formed in such a photolithography process, the gate structure 218 has an initial length 220.

Figure 7:
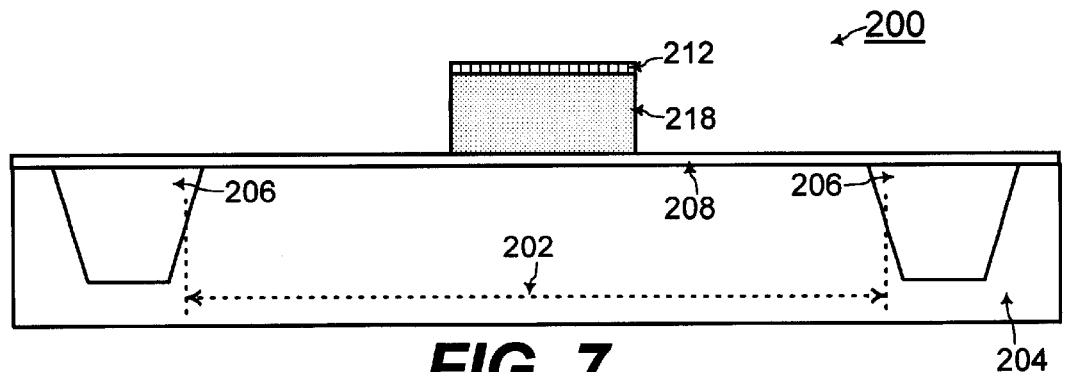

Referring to FIGS. 6 and 7, the gate photoresist structure 216 comprised of photo-resist material is then removed from the BARC (bottom anti-reflective coating) material 212 remaining on top of the gate structure 218. Processes for removing photo-resist material are known to one of ordinary skill in the art of integrated circuit fabrication.

Figure 8:
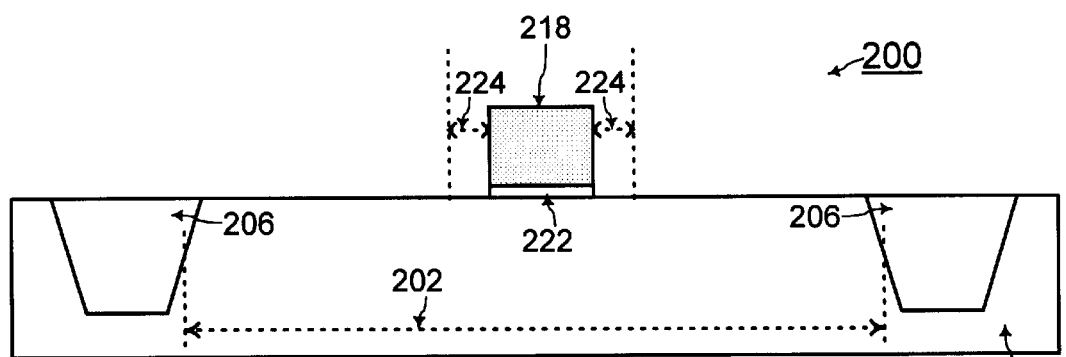

Referring to FIGS. 7 and 8, the BARC (bottom anti-reflective coating) material 212 is stripped away from the gate structure 218 using an etching reactant that etches both the BARC (bottom anti-reflective coating) material 212 and the gate electrode material comprising the gate structure 218. For example, when the BARC (bottom anti-reflective coating) material 212 is comprised of silicon oxynitride (SiON) and when the gate structure 218 is comprised of polysilicon that is doped, an example of such an etching reactant is phosphoric acid ($H_3PO_4$). In one embodiment of the present invention, the etching reactant comprised of phosphoric acid ($H_3PO_4$) is heated to a temperature of about 80° Celsius.

Further referring to FIG. 8, during this step of stripping away the BARC (bottom anti-reflective coating) material 212, the side walls of the gate structure 218 are exposed to the etching reactant that etches away the gate structure 218 by a trim length 224 at each of the side walls of the gate structure 218. Referring to FIGS. 2 and 8, the dopant concentration of the N-type dopant or P-type dopant within the gate structure 218 determines the etch rate in the etching reactant of the gate electrode material comprising the gate structure 218. Generally, an increase in the dopant concentration of the N-type dopant or P-type dopant within the gate structure 218 increases the etch rate in the etching reactant of the gate electrode material such as polysilicon comprising the gate structure 218. Thus, referring to FIGS. 2 and 8, the dopant concentration of the N-type dopant or P-type dopant within the gate structure is adjusted during the implantation process for implanting the N-type dopant or P-type dopant to control the trim length 224 during the step of stripping away the BARC (bottom anti-reflective coating) material 212.

Similarly, referring to FIGS. 3 and 8, the neutral dopant concentration of the neutral dopant within the gate structure 218 determines the etch rate in the etching reactant of the gate electrode material comprising the gate structure 218. Generally, an increase in the neutral dopant concentration of the neutral dopant within the gate structure 218 increases the etch rate in the etching reactant of the gate electrode material such as polysilicon comprising the gate structure 218. Thus, referring to FIGS. 3 and 8, the neutral dopant concentration of the neutral dopant within the gate structure is adjusted during the implantation process for implanting the neutral dopant to control the trim length 224 during the step of stripping away the BARC (bottom anti-reflective coating) material 212.

Figure 9:
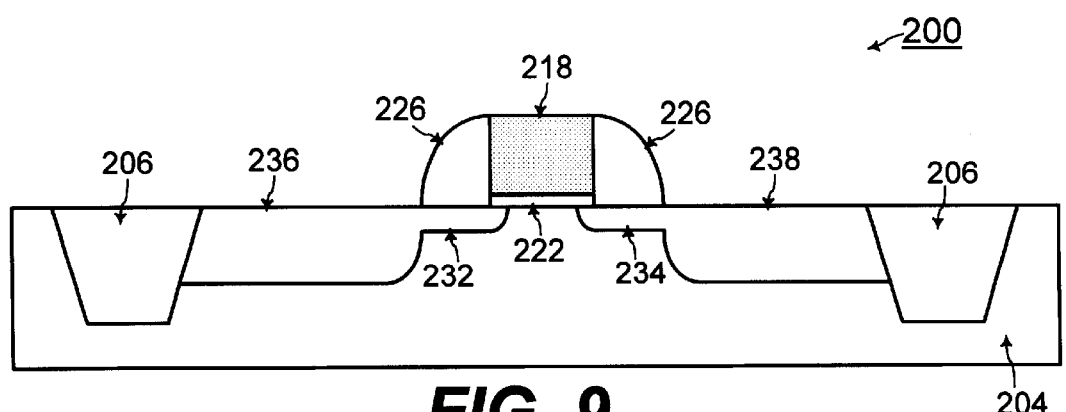

In addition, during the step of stripping away the BARC (bottom anti-reflective coating) material 212, any exposed regions of the layer of gate dielectric material 208 is etched away to form a gate dielectric 222 of the MOSFET 200 in one embodiment of the present invention. The gate dielectric 222 of the MOSFET 200 is comprised of the gate dielectric material 208 that remains under the gate structure 218. Referring to FIG. 9, conventional structures of the MOSFET 200 are formed such as spacers 226 at the sidewalls of the gate dielectric 222 and the gate structure 218. In addition, a drain extension 232 and a source extension 234 are formed under the spacers 226. The drain extension 232 and the source extension 234 are shallow junctions to minimize short-channel effects in the MOSFET 200 having submicron or nanometer dimensions, as known to one of ordinary skill in the art of integrated circuit fabrication. A drain contact junction 236 and a source contact junction 238 are formed in exposed regions of the active device area 202 of the semiconductor substrate 204. The drain contact junction 236 and the source contact junction 238 are fabricated as deeper junctions such that a relatively large size of drain silicide and source silicide respectively may be fabricated therein to provide low resistance contact to the drain and the source respectively of the MOSFET 200, as known to one of ordinary skill in the art of integrated circuit fabrication. Processes for formation of such conventional structures of a MOSFET are known to one of ordinary skill in the art of integrated circuit fabrication.

In this manner, the side walls of the gate structure 218 are trimmed down to reduce the length of the gate structure 218 beyond the initial length 220 achievable with photolithography processes. The trim length 224 is controlled by adjusting the doping of the gate structure 218. In addition, the side walls of the gate structure 218 are trimmed down during the step of stripping the BARC (bottom anti-reflective coating) material 212 from the gate structure 218 such that additional processing steps are minimized.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "sidewall," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for fabricating a field effect transistor within an active device area of a semiconductor substrate, the method including the steps of:

A. depositing a layer of gate dielectric material on said semiconductor substrate;

B. depositing a layer of gate electrode material on said layer of gate dielectric material, said gate electrode material being a semiconductor material;

C. implanting one of an N-type dopant or a P-type dopant into said layer of gate elecorde material such that said one of an N-type dopant or a P-type dopant has a dopant concentration in said layer of gate electrode material, and adjusting said dopant concentration of said one of N-type or P-type dopant with a dopant dose of said N-type or P-type dopant during said step C of implanting said one of N-type or P-type dopant in said gate electrode material to modify an etch rate of said gate electrode material in an etching reactant for etching BARC (bottom anti-reflective coating) material;

D. depositing a layer of BARC (bottom anti-reflective coating) material on said layer of gate electrode material;

E. depositing a layer of photo-resist material and patterning said layer of photo-resist material, said layer of BARC (bottom anti-reflective coating) material, and said layer of gate electrode material to form a gate structure of said field effect transistor, said gate structure being comprised of said gate electrode material;

wherein said BARC (bottom anti-reflective coating) material remains on said gate structure;

F. removing said photo-resist material from said BARC (bottom anti-reflective coating) material remaining on top of said gate structure;

G. stripping said BARC (bottom anti-reflective coating) material from said gate structure using said etching reactant that etches both of said BARC (bottom anti-reflective coating) material and said gate electrode material having said one of an N-type dopant or a P-type dopant, wherein said etch rate of said gate electrode material having said one of an N-type dopant or a P-type dopant in said etching reactant increases with an increase of said dopant concentration of said one of an N-type dopant or a P-type dopant in said gate electrode material, and wherein sidewalls of said gate structure are trimmed by a trim length during said step of stripping said BARC (bottom anti-reflective coating) material from said gate structure to reduce the length of the gate structure beyond that achievable with photolithography processes; and increasing said dopant concentration of said one of N-type or P-type dopant in said gate electrode material during said step C of implanting said on of N-type or P-type dopant to increase said trim length of said gate structure, or decreasing said dopant concentration of said one of N-type or P-type dopant in said gate electrode material during said step C of implanting said one of N-type or P-type dopant to decrease said trim length of said gate structure.

2. The method of claim 1, further comprising the steps of implanting an additional neutral dopant into said layer of gate electrode material such that said neutral dopant has a neutral dopant concentration in said layer of gate electrode material, after said step C and before said step D, wherein said etch rate of said gate electrode material having said neutral dopant in said etching reactant increases with an increase of said neutral dopant concentration in said gate electrode material, and adjusting said neutral dopant concentration of said neutral dopant in said gate electrode material to control said trim length of said gate structure.

3. The method of claim 1, wherein said gate electrode material is comprised of polysilicon, wherein said BARC (bottom anti-reflective coating) material is comprised of silicon oxynitride (SiON), and wherein said etching reactant is comprised of phosphoric acid ($H_3PO_4$).

4. The method of claim 1, further comprising the step of:

performing a thermal anneal after said step of implanting said one of an N-type dopant or a P-type dopant into said layer of gate electrode material.

5. The method of claim 3, wherein said etching reactant comprised of phosphoric acid ($H_3PO_4$) is heated to a temperature of about 80° Celsius.

6. The method of claim 4, wherein said thermal anneal is performed at a temperature in a range of from about 950° Celsius to about 1025° Celsius.

7. The method of claim 2, wherein said gate electrode material is comprised of polysilicon, and wherein said neutral dopant is comprised of germanium.

8. The method of claim 2, further comprising the step of:

performing a thermal anneal after said step of implanting said one of an N-type dopant or a P-type dopant into said layer of gate electrode material and after said step of implanting said neutral dopant into said layer of gate electrode material.

9. The method of claim 7, wherein said BARC (bottom anti-reflective coating) material is comprised of silicon oxynitride (SiON) having a thickness in a range of from about 150 Å (angstroms) to about 250 Å (angstroms), and wherein said etching reactant is comprised of phosphoric acid ($H_3PO_4$).

10. The method claim 8, wherein said thermal anneal is performed at a temperature in a range of from about 950° Celsius to about 1025° Celsius.

11. The method of claim 9, wherein said etching reactant comprised of phosphoric acid ($H_3PO_4$) is heated to a temperature of about 80° Celsius.

12. A method for fabricating a MOSFET (metal oxide semiconductor field effect transistor) within an active device area of a semiconductor substrate, the method including the steps of:
   A. depositing a layer of gate dielectric material on said semiconductor substrate comprised of silicon;
   B. depositing a layer of gate electrode material comprised of polysilicon on said layer of gate dielectric material;
   C. implanting one of an N-type dopant or a P-type dopant into said-layer of gate electrode material such that said one of an N-type dopant or a P-type dopant has a dopant concentration in said layer of gate electrode material, and adjusting said dopant concentration of said one of N-type or P-type dopant with a dopant dose of said N-type or P-type dopant during said step C of implanting said one of N-type or P-type dopant in said gate electrode material to modify an etch rate of said gate electrode material in an etching reactant for etching BARC (bottom anti-reflective coating) material;
   D. implanting an additional neutral dopant comprised of germanium into said layer of gate electrode material such that said neutral dopant has a neutral dopant concentration in said layer of gate electrode material, and adjusting said neutral dopant concentration of said neutral dopant with a dopant dose of said neutral dopant during said step D of implanting said neutral dopant in said gate electrode material to control said etch rate of said gate electrode material in said etching reactant for etching said BARC (bottom anti-reflective coating) material;
   E. performing a thermal anneal after said step of implanting said one of an N-type dopant or a P-type dopant into said layer of gate electrode material and after said step of implanting said neutral dopant into said layer of gate electrode material, at a temperature in a range of from about 950° Celsius to about 1025° Celsius;
   F. depositing a layer of BARC (bottom anti-reflective coating) material comprised of silicon oxynitride (SiON) having a thickness in a range of from about 150 Å (angstroms) to about 250 Å (angstroms) on said layer of gate electrode material;
   G. depositing a layer of photo-resist material and patterning said layer of photo-resist material, said layer of BARC (bottom anti-reflective coating) material, and said layer of gate electrode material to form a gate structure of said MOSFET, said gate structure being comprised of said gate electrode material;

wherein said BARC (bottom anti-reflective coating) material remains on said gate structure;

H. removing said photo-resist material from said BARC (bottom anti-reflective coating) material remaining on said gate structure;
   I. stripping said BARC (bottom anti-reflective coating) material from said gate structure using said etching reactant comprised of phosphoric acid ($H_3PO_4$) that is heated to a temperature of about 80° Celsius and that etches both of said BARC (bottom anti-reflective coating) material and said gate electrode material having said one of an N-type dopant or a P-type dopant, wherein said etch rate of said gate electrode material having said one of an N-type dopant or a P-type dopant in said etching reactant increases with an increase of said dopant concentration of said one of an N-type dopant or a P-type dopant in said gate electrode material, and wherein sidewalls of said gate structure are trimmed by a trim length during said step of stripping said BARC (bottom anti-reflective coating) material from said gate structure to reduce the length of the gate structure beyond that achievable with photolithography processes;

increasing said dopant concentration of said one of N-type or P-type dopant in said gate electrode material during said step C of implanting said one of N-type or P-type dopant to increase said trim length of said gate structure, or decreasing said dopant concentration of said one of N-type or P-type dopant in said gate electrode material during said step C of implanting said one of N-type or P-type dopant to decrease said trim length of said gate structure;

and wherein said etch rate of said gate electrode material having said neutral dopant in said etching reactant increases with an increase of said neutral dopant concentration in said gate electrode material, and increasing said concentration of said neutral dopant in said gate electrode material during-said step D of implanting said neutral dopant to increase said trim length of said gate structure, or decreasing said concentration of said neutral dopant in said gate electrode material during said step D of implanting said neutral dopant to decrease said trim length of said gate structure.

* * * * *